US012205651B2

(12) United States Patent
Lo Giudice et al.

(10) Patent No.: US 12,205,651 B2
(45) Date of Patent: Jan. 21, 2025

(54) METHOD FOR ACCESSING MEMORY CELLS, CORRESPONDING CIRCUIT AND DATA STORAGE DEVICE

(71) Applicant: STMicroelectronics S.r.l., Agrate Brianza (IT)

(72) Inventors: Gianbattista Lo Giudice, Pedara (IT); Antonino Conte, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 315 days.

(21) Appl. No.: 17/940,753

(22) Filed: Sep. 8, 2022

(65) Prior Publication Data

US 2023/0087074 A1    Mar. 23, 2023

(30) Foreign Application Priority Data

Sep. 22, 2021   (IT) .................. 102021000024365

(51) Int. Cl.
   *G11C 16/04*   (2006.01)
   *G11C 16/24*   (2006.01)
   *G11C 16/26*   (2006.01)
(52) U.S. Cl.
   CPC ............. *G11C 16/24* (2013.01); *G11C 16/26* (2013.01)

(58) Field of Classification Search
   CPC .................. G11C 16/24; G11C 16/26
   See application file for complete search history.

(56) References Cited

U.S. PATENT DOCUMENTS

| | | | | |
|---|---|---|---|---|
| 6,512,697 | B1 * | 1/2003 | Li ................ | G11C 7/067 365/207 |
| 7,324,394 | B1 * | 1/2008 | Yoon ............. | G11C 7/065 365/207 |
| 2006/0245234 | A1 | 11/2006 | Hush et al. | |
| 2010/0195415 | A1 | 8/2010 | Seko | |
| 2012/0194222 | A1 * | 8/2012 | Hoefler .......... | G11C 7/04 327/512 |
| 2019/0096480 | A1 | 3/2019 | Conte | |
| 2019/0385685 | A1 | 12/2019 | Qiang et al. | |

* cited by examiner

*Primary Examiner* — Pho M Luu
(74) *Attorney, Agent, or Firm* — Slater Matsil, LLP (57) ABSTRACT

A method for accessing memory cells in an array of memory cells storing respective data signals, wherein memory cells in the array of memory cells have a first, resp. second, node selectively couplable to respective bitline branches in a first, resp. second, set of bitline branches, wherein the first and the second set of bitline branches provide at least one bitline capacitance configured to store a bias level of charge in response to being charged.

20 Claims, 4 Drawing Sheets

METHOD FOR ACCESSING MEMORY CELLS, CORRESPONDING CIRCUIT AND DATA STORAGE DEVICE

CROSS-REFERENCE TO RELATED APPLICATIONS

This application claims priority to Italian Patent Application No. 102021000024365, filed on Sep. 22, 2021, which application is hereby incorporated by reference herein in its entirety.

TECHNICAL FIELD

The present disclosure generally relates to data storage devices, and in particular embodiments, to techniques for accessing data stored in the data storage devices.

BACKGROUND

Generally, a data storage device such as a memory circuit block in a semiconductor device ("chip" or "die") includes an array of memory cells. For example, the memory cells in the array can be arranged in rows (referred to as wordlines or WLs) and columns (referred to as bitlines or BLs) in the semiconductor chip so that a cell of the array lies at the intersection of a particular wordline and bitline. This can be used as a respective memory address.

An access time for reading a memory cell is a relevant figure of merit in assessing the performance of memory circuit blocks.

Accessing a memory cell in a memory circuit block to read its contents exploits sense amplifier circuits. For example, two complementary bitlines of the array of memory cells can be coupled to a sense amplifier at the edge of the array. The data items in the memory cells are read (or written) by the same bitlines that run along the top of the rows and columns. A sense amplifier can exploit pre-charges of bitlines to perform current difference sensing.

Sense amplifiers are relevant elements in CMOS memories. Their performance significantly affects both memory access time and overall power dissipation.

Typically, sense amplifier design is a complex process that considers the possibility of increasing speed, improving capacity, and maintaining low power dissipation in CMOS memories. For example, sense amplifier performance is affected if memory capacity is increased and the supply voltage is reduced.

Conventionally, increasing the number of memory cells per bitline increases the parasitic bitline capacitance, decreasing the memory cell area to be able to integrate more memory cells in a single chip reduces the current driving a heavily loaded bitline, and decreasing the supply voltage results in reduced noise margins that in turn affect sense amplifier reliability.

Pre-charging capacitances take up a considerable amount of the reading time; this can grow with the size of the cells in the memory array and produce a peak of current consumption. For example, to generate an output indicative of the state of the memory cell being read during a read operation, the parasitic capacitance of the bitline is brought to the operating voltage levels of the sense amplifier. In such a context, with bitlines heavily loaded by parasitic capacitances (particularly in high-density memory arrays), the operating point of the pre-charge circuit can be hard to control.

Conventional solutions using active power supplies (e.g., voltage regulators) suffer from the presence of current peaks. These peaks may affect the power supply regulated level provided by the power supply device, For example, by injecting noise caused by a high current peak.

Conventional solutions for fast bitline pre-charge suffer from various drawbacks such as (i) the complex circuitry involved, in particular in the case of sizable memory arrays, (ii) a shorter pre-charge comes at the cost of a higher current consumption peak, and (iii) circuits with feedback loops have limited bandwidth.

SUMMARY

An object of one or more embodiments is to contribute in overcoming the drawbacks discussed in the foregoing.

According to one or more embodiments, that object can be achieved by a method having the features set forth in the claims that follow.

One or more embodiments relate to a corresponding circuit.

One or more embodiments relate to a corresponding data storage device (e.g., a non-volatile memory unit).

The claims are an integral part of the technical teaching provided herein with reference to the embodiments.

One or more embodiments facilitate performing a fast bitline pre-charge phase, particularly in sizable memory arrays.

One or more embodiments facilitate evening out current consumption peaks during fast pre-charge.

One or more embodiments facilitate reducing current consumption peaks.

One or more embodiments exploit charge sharing between a biasing tank capacitance and the capacitances in the bitline; this facilitates reducing supply circuitry usage.

One or more embodiments facilitate slowly restoring the charge of bitline capacitances between pre-charge phases and reading phases.

One or more embodiments facilitate simple implementation with a reduced supply line sizing.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment.

Moreover, particular configurations, structures, or characteristics may be combined in any adequate way in one or more embodiments.

The drawings are in simplified form and are not to precise scale.

Throughout the figures annexed herein, like parts or elements are indicated with like references/numerals, and a corresponding description will not be repeated for brevity.

The references used herein are provided merely for convenience and hence do not define the extent of protection or the scope of the embodiments.

Figure 1:
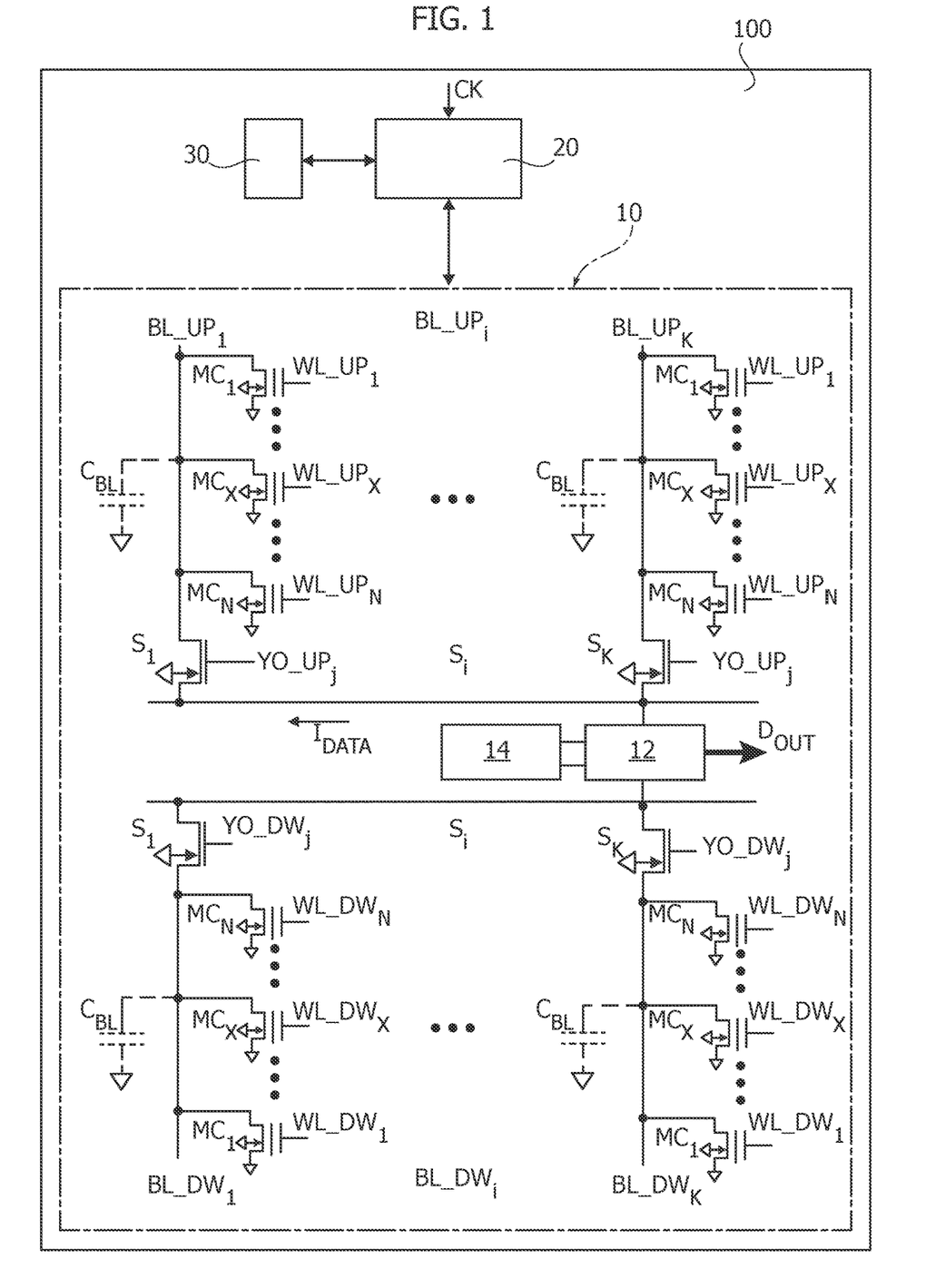
FIG. 1 is a diagram embodiment of the principles underlying the operation of sense amplifiers.

FIG. 1 is an exemplary representation of a memory circuit block 10, including an array of (e.g., MOSFET-based) memory cells $MC_1, \ldots, MC_x, \ldots,$ and $MC_N$.

Each memory cell has a current path therethrough between a first node and a second node.

The first nodes of the memory cells $MC_1, \ldots, MC_x, \ldots,$ and $MC_N$ are configured to be selectively coupled (e.g., via a first set of switches $S_1, S_i, S_K$) to a respective first set of bitline branches $BL\_UP_1, BL\_UP_i, BL\_UP_K$.

The second nodes of the memory cells $MC_1, \ldots, MC_x, \ldots,$ and $MC_N$ are configured to be selectively coupled (e.g., via a second set of respective switches $S_1, S_i, S_K$) to a second set of bitline branches $BL\_DW_1, BL\_DW_i, BL\_DW_K$.

Each memory cell (see, e.g., the floating-gate cell $MC_1$) is configured to store data that can be accessed (or read) or modified (or written) by selectively coupling the first and second nodes to the respective bitline branches $BL\_UP_1$, $BL\_DW_1$, in the first and second sets of bitlines branches $BL\_UP_1$, $BL\_UP_i$, $BL\_UP_K$, $BL\_DW_1$, $BL\_DW_i$, $BL\_DW_K$.

As illustrated in FIG. 1, sense amplifier circuitry 12 is coupled to the array of memory cells $MC_1$, $MC_x$, and $M_{CN}$ via the first and second sets of bitline branches $BL\_UP_1$, $BL\_UP_i$, $BL\_UP_K$, $BL\_DW_1$, $BL\_DW_i$, $BL\_DW_K$; the sense amplifier circuitry 12 is configured to sense or detect stored data from a read-selected memory cell (e.g., $MC_1$).

As illustrated in FIG. 1, pre-charge circuitry 14 is coupled to the bitlines BL via the sense amplifier circuitry 12 (for example, via a bypass therein); the pre-charge circuit 14 is configured to charge the first and/or second sets of bitlines $BL\_UP_1, BL\_UP_i, BL\_UP_K, BL\_DW_1, BL\_DW_i, BL\_DW_K$ by loading a certain electric charge thereon, for example, before a reading operation is performed on a selected memory cell (e.g., $MC_1$).

As exemplified in FIG. 1, the read-selected memory cell (e.g., $MC_1$) is selected via activation of at least one respective switch (e.g., $S_1$) coupled therewith.

In embodiments, in response to activation of switches, such as $S_1$, for example, the memory cell $MC_1$ selected to be read produces a current $I_{DATA}$ that removes some of the charge dQ stored on the pre-charged first set of bitlines $BL\_UP_1, BL\_UP_i, BL\_UP_K$.

For the sake of simplicity, arrays are discussed herein by referring to a linear array of memory cells $MC_1, \ldots, MC_x, \ldots, MC_N$.

It will be otherwise appreciated that this representation is purely exemplary and in no way limiting: the embodiments apply mutatis mutandis to notionally any other array arrangement of memory cells $MC_1, \ldots, MC_x, \ldots, MC_N$, e.g., planar arrays.

The representation of FIG. 1 shows that packing an increasing number of cells $MC_1, \ldots, MC_x, \ldots, MC_N$ in memory circuits such as circuit 10 leads to an increasingly shared access to bitlines in the first set of bitlines and the second set of bitlines.

These lines have a parasitic capacitance $C_{BL}$ that can be relatively large (e.g., up to some picoFarads, with 1 picoFarad=1 pF=$10^{-12}$ Farad) if compared, for example, with the capacitance of other components in memory 10.

As exemplified in FIG. 1, in the presence of an increasing bitline capacitance $C_{BL}$, a bitline voltage swing $dV_{BL}$ caused by removing a charge dQ from the bitline branch BL (e.g., $dV_{BL}=dQ/C_{BL}$) can be relatively small.

Sense amplifier circuitry 12, as exemplified in FIG. 1, is configured to translate such a voltage variation $dV_{BL}$ into an amplified logic signal $D_{OUT}$ that can be further processed (e.g., via digital logic 20).

As exemplified in FIG. 1, the memory circuit block 100 can be embedded in an electronic device 100, such as a micro-controller device 100, with the memory 10 acting as a non-volatile memory (briefly, NVM) for storing code, for example.

As exemplified in FIG. 1, the electronic device 100 includes a processing unit 20, such as a microprocessor, for example. The processing unit 20 is configured to be coupled to the memory 10 to provide control signals to drive (in a synchronized manner based on a clock signal CK, for example) the sense amplifier circuitry 12 to read/write data stored in the memory cells $MC_1, \ldots, MC_x, \ldots, MC_N$, as discussed in the following.

As exemplified in FIG. 1, the processing unit 20 is further configured to receive signals read and program signals written in the memory cells $MC_1, \ldots, MC_x, \ldots, MC_N$ of the memory 10.

As exemplified in FIG. 1, an input/output (briefly, I/O) interface unit 30 is coupled to the processing unit 20 and configured to trigger communication of the electronic device 100 with the outside world, for example, external peripheral systems.

Figure 2:
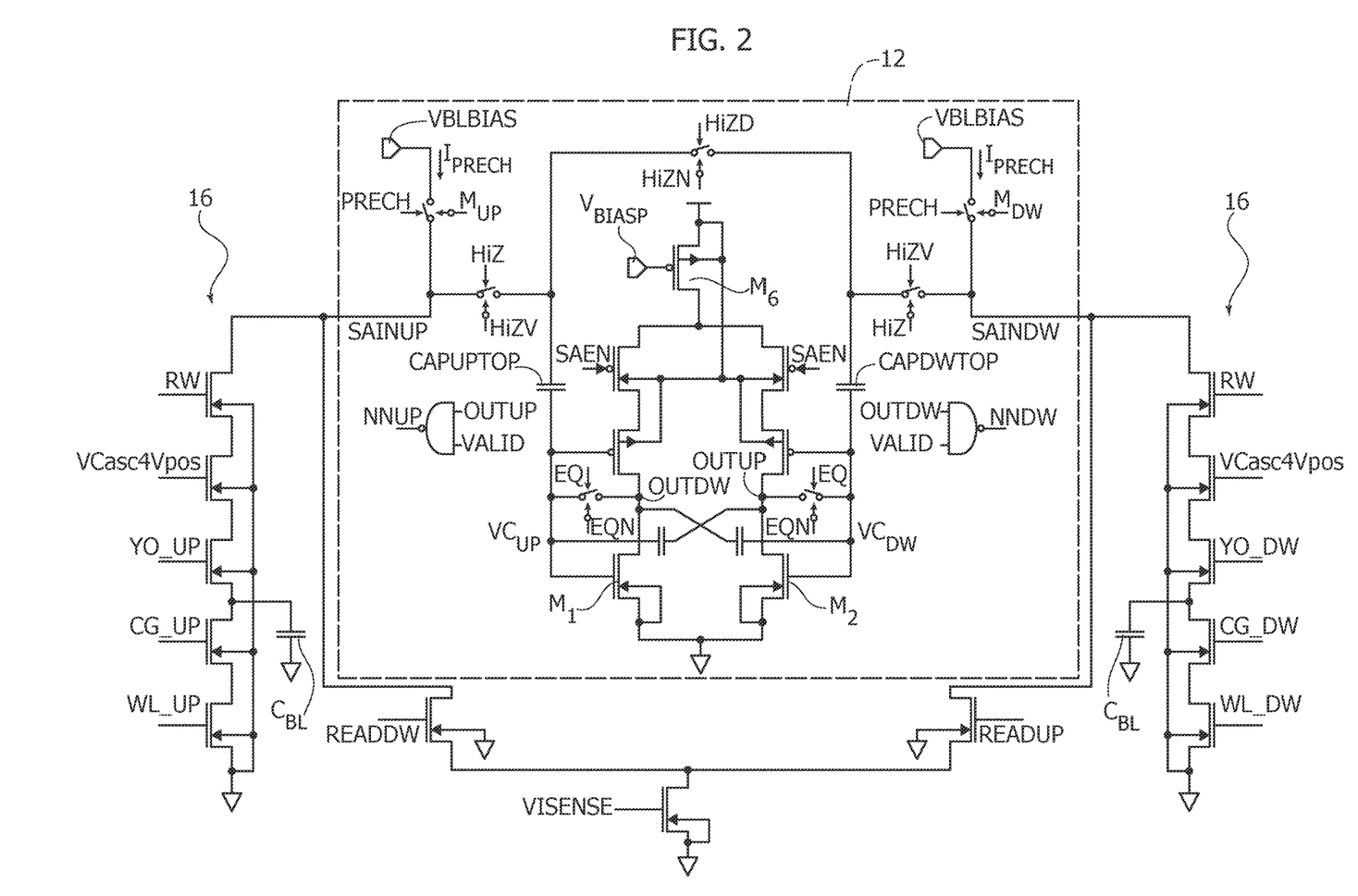
FIG. 2 is a diagram embodiment of a sense amplifier.

As exemplified in FIG. 2, a latch sense amplifier circuit, as disclosed in document U.S. Pat. No. 10,573,382 B2 (assigned to the same assignee of the present application and incorporated by reference herein in its entirety), is suitable for use as a sense amplifier circuitry 12 in one or more embodiments.

As exemplified in FIG. 2, the sense amplifier circuitry 12 is coupled to the equivalent capacitance $C_{BL}$ of the bitlines via decoders 16 configured to select a certain memory cell (e.g., $MC_1$) in the array of memory cells $MC_1, \ldots, MC_x, \ldots, MC_N$. Selection of memory cells (e.g., M1) by the decoders 16 can occur in a manner known per se to those of skill in the art so a detailed discussion will not be provided for the sake of brevity.

Also, one or more embodiments are discussed in the following, mainly with respect to the latch sense amplifier circuit 12 of FIG. 2. It will be otherwise understood that such a circuit architecture is purely exemplary and in no way limiting.

Various types of sense amplifiers can be used in the embodiments, inasmuch as these are configured to possibly operate with bitlines BLs biased at the desired voltage VBIAS_SUPPLY during a sensing phase in a discontinuous manner (that is, not during a whole sensing phase, but also portions of a sensing phase).

A sense amplifier, as exemplified in FIG. 2, has a differential structure including a first circuit portion whose nodes are indicated by the suffix "UP" and are configured to be coupled to the first set of bitline branches $BL\_UP_1$, $BL\_UP_i$, $BL\_UP_K$, and a second circuit portion whose nodes are indicated by suffix "DW" and are configured to be coupled to the second set of bitline branches $BL\_DW_1$, $BL\_DW_i$, $BL\_DW_K$.

As exemplified in FIG. 2, the sense amplifier 12 includes at least one voltage supply node VBLBIAS configured to receive a power supply (e.g., voltage) level from the pre-charge circuit 14, as well as data nodes SAINUP, SAINDW including a first data node SAINUP and a second data node SAINDW.

As exemplified in FIG. 2, the first data node SAINUP is configured to be coupled to a first branch (e.g., $BL\_UP_1$) of the first set of bitline branches $BL\_UP_1$, $BL\_UP_i$, $BL\_UP_K$, and the second data node SAINDW is configured to be coupled to a first branch (e.g., BL_UP1) the first set of bitline branches $BL\_UP_1$, $BL\_UP_i$, $BL\_UP_K$.

As exemplified in FIG. 2, one of the data nodes (e.g., SAINUP) is configured to sense the voltage variation (e.g., $dV_{BL}$) in the respective (e.g., first $BL\_UP_1$) bitline branch due to the memory cell being read (e.g., $MC_1$), while the other data node (e.g., SAINDW) is configured to sense a reference (voltage) signal VISENSE, the sense amplifier 12 configured to perform a comparison of the sensed voltage variation (e.g., $dV_{BL}$) and the reference signal VISENSE.

As exemplified in FIG. 2, a set of switches $M_{UP}$ and $M_{DW}$ is interposed in the power supply node VBLBIAS.

As illustrated, such a set of switches $M_{UP}$, $M_{DW}$ includes: i) a first switching transistor $M_{UP}$ having a current path therethrough between a first node coupled to the power supply node VBLBIAS and the first data node SAINUP of the sense amplifier 12; the first switching transistor $M_{UP}$ has a control node PRECH configured to selectively couple the bitline capacitance $C_{BL}$ to the power supply node VBLBIAS, via the first data node SAINUP, based on a first control signal PRECH (provided by the processor unit 20, for example) received at the control node PRECH, and ii) a second switching transistor $M_{DW}$ having a current path therethrough between a respective first node coupled to the power supply node VBLBIAS and the second data node SAINDW of the sense amplifier 12; the second switching transistor $M_{DW}$ has a control node PRECH configured to selectively couple the bitline capacitance $C_{BL}$ to the power supply node VBLBIAS, via the second data node SAINDW, based on a first control signal PRECH (provided by the processor unit 20, for example) received at the control node PRECH.

For example, in the operation of an arrangement as exemplified in FIG. 2: the first switch $M_{UP}$ and the second switch $M_{DW}$ are configured to be driven to be in a first (e.g., closed or conductive) state based on the first control signal PRECH having a first signal (e.g., "1" or "high"), so that the respective current flow paths are made conductive and having a current IPRECH flowing therethrough during the first state, and the first switch $M_{UP}$ and the second switch $M_{DW}$ are configured to be driven to be in a second (e.g., open or non-conductive) state based on the first control signal PRECH having a second value (e.g., "1" or "high"), so that the respective current flow paths are made non-conductive during the second state.

As exemplified in FIG. 2, when the first and second switches $M_{UP}$ and $M_{DW}$ are in the first, closed or conductive state, the power supply is coupled to the bitline branches BL_UP, BL_DW of the bitlines BL so that bitlines capacitance $C_{BL}$ can be charged up during the pre-charge phase, as discussed in the following.

As exemplified in FIG. 2 (and in a way per se known to those of skill in the art), the sense amplifier 12 may be configured to perform sense amplification processing of signals received at the first and second data nodes based on an "enable" signal SAEN asserted with a first (e.g., "0" or "low") value.

Figures 3, 4:
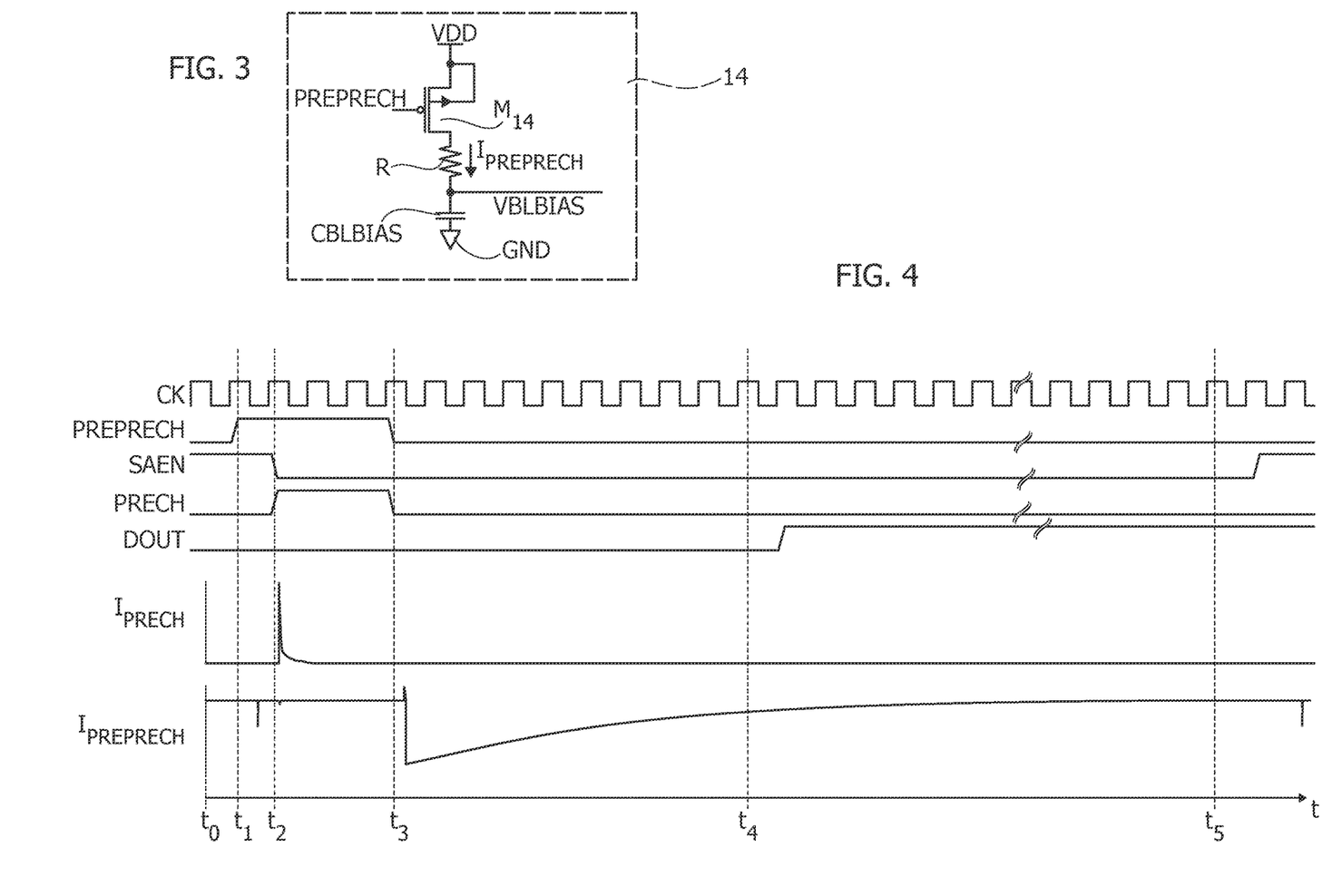
FIG. 3 is an embodiment circuit diagram of a pre-charge circuit in a sense amplifier.
FIG. 4 is a time diagram embodiment of possible time behaviors of signals that may occur in one or more embodiments.

A pre-charge circuit 12, as exemplified in FIG. 3, includes a first switch M14, e.g., p-channel MOSFET transistor, having a control node PREPRECH and a current path therethrough between a power supply node VDD (e.g., at a bias voltage level VDD provided via power supply circuitry not visible in the Figure, for example) to a second node VBLBIAS: the current path includes a resistance R (e.g., an external resistor or the internal resistance of the transistor M14), the transistor M14 configured to selectively provide a current flow across the resistance R based on a second control signal PREPRECH (provided by the microprocessor, For example) received at the respective control node.

A pre-charge circuit 12, as exemplified in FIG. 3, also includes a tank capacitance CBLBIAS coupled to the second node VBLBIAS of the transistor M14 and configured to be alternatively charged via the current flowing in the transistor M14 or discharged when coupled to the bitline capacitance $C_{BL}$, as discussed in the following.

In embodiments, in the operation of an arrangement as exemplified in FIG. 3: the transistor M14 is configured to be driven in a first (e.g., closed or conductive) state based on the first control signal PREPRECH having a first signal (e.g., "0" or "low"), the current flow path therethrough configured to be made conductive and having a current IPREPRECH flowing therethrough during the first state, the transistor M14 is configured to be driven in a second (e.g., open or non-conductive) state based on the first control signal PREPRECH having a second signal (e.g., "1" or "high"), the current flow path therethrough configured to be made non-conductive during the second state.

As exemplified in FIGS. 2 and 3, the bitline supply node VBLBIAS of the sense amplifier 12 is configured to be coupled to the voltage supply node VBLBIAS interposed between the tank capacitance $C_{BL}$ and the transistor M14.

In embodiments, the tank capacitance CBLBIAS is configured to store a charge adequate to pre-charge the bitlines capacitances $C_{BL}$ (or at least a fraction thereof, as discussed in the following with reference to FIG. 6) when coupled thereto.

It was observed that the pre-charge circuit 14 facilitates pre-charging the bitline capacitance $C_{BL}$ without producing current spikes that affect the power supply circuitry. This is due to charge-sharing between the reactive biasing tank capacitance CBLBIAS and the bitline capacitance $C_{BL}$ so that no power supply circuitry is directly coupled to the bitlines $C_{BL}$ during a pre-charge phase, as discussed in the following.

FIG. 4 illustrates a possible time diagram of the first PRECH and second PREPRECH control signals, enable signal SAEN and an output signal $D_{OUT}$ of the sense amplifier circuitry 12 in one or more embodiments of the method of pre-charging bitline capacitance $C_{BL}$ as per the present disclosure.

FIG. 4 also shows exemplary time diagrams of the behavior of the current $I_{PRECH}$ flowing in the first and second transistors $M_{UP}$, $M_{DW}$ when made conductive and the current IPREPRECH flowing in the current flow path of the transistor M14 when made conductive.

As exemplified in FIG. 4: in an initial phase (e.g., at initial time instant $t_0$), the enable signal SAEN is asserted with a value (e.g., "high") that disables the sensing of data signals SAINUP, SAINDW; at the same time, the second control signal PREPRECH is asserted to a first (e.g., "0" or "low") state; as a result, the current flow path of the pre-charge transistor M14 is made conductive and the tank capacitance CBLBIAS is coupled to the power supply VDD and (e.g., slowly) charged; during charge of the tank capacitance CBLBIAS, the first control signal PRECH is also in the second state (e.g., "0" or "low"), so that the current flow path of the first $M_{UP}$ and second $M_{DW}$ switching transistors in the sense amplifier 12 is made non-conductive and the voltage supply node VBLBIAS of the pre-charge circuit 14 is decoupled from the bitline capacitance $C_{BL}$; at a first time instant $t_1$, the second control signal PREPRECH is asserted in the second state (e.g., "high") so that the power supply VDD is decoupled from the tank capacitance CBLBIAS; at the same time, the first control signal PRECH remains in the second state so that the switches $M_{UP}$, $M_{DW}$ remain open and the voltage at the biasing node VBLBIAS becomes the voltage across the charged tank capacitance CBLBIAS; at a second time instant $t_2$, the enable signal SAEIN is asserted to the first value (e.g., "low") so that sensing at data nodes SAINUP, SAINDW of the sense amplifier 12 is activated; at the same time, second control signal remains asserted in the second state (e.g., "high") so that the second transistor M14 remains non-conductive and the power supply line VDD is isolated from the tank capacitance CBLBIAS; at the same time, the first control signal PRECH is asserted in the first state (e.g., "high") so that the current paths of transistors $M_{UP}$, $M_{DW}$ are made conductive and a current $I_{PRECH}$ flows therein; as a result, the capacitance CBLBIAS is coupled to the bitline capacitance(s) $C_{BL}$ that are quickly charged up (For example, in a time interval about 2 ns, with 1 ns=1 nanosecond=$10^{-9}$ seconds) as a result of the charge accumulated in the tank CBLBIAS being shared with the bitline capacitances $C_{BL}$ during the pre-charge phase PRECH.

As exemplified in FIG. 4, a spike can be observed in the signal $I_{PRECH}$ (immediately) after the second instant $t_2$. It is noted that this current peak is adequately managed by the reactive component CBLBIAS while decoupled (e.g., thanks to PREPRECH in the "high" state) from any power supply circuitry VDD so that it does not influence or damage the power supply line VDD while providing a quick and effective pre-charge of the bitlines $C_{BL}$.

As exemplified in FIG. 4, For example: at a third time instant $t_3$, the pre-charge phase ends in response to the first control signal PRECH being asserted in the respective second state (e.g., "low") and the second control signal PREPRECH being also switched and asserted in the respective first state (e.g., "low"); this involves making non-conductive the current flow path first and second transistors $M_{UP}$, $M_{DW}$ of the sense amplifier 12 and making conductive the current flow path of the respective pre-charge circuit transistor M14.

As exemplified in FIG. 4, (soon) after the third time instant $t_3$, a non-zero current $I_{PREPRECH}$ starts to flow into the resistance R of the pre-charge circuit M14 to replenish the charge previously stored in the tank capacitance CBLBIAS, consumed to pre-charge the bitline capacitance $C_{BL}$ in the previous pre-charge phase $t_2$ to $t_3$.

In the example of FIG. 4, For example: at a fourth time instant $t_4$, an output signal Dour is asserted as a result of sense amplifier processing 12 performed on the sensed data signals SAINUP, SAINDW, in a manner per se known, at a fifth time instant $t_5$, the tank capacitance CBLBIAS has almost completed restoring charge, for example to the same level it had at initial time instant $t_0$ so that a new pre-charge phase can take place as discussed in the foregoing with respect to time interval $t_0$ to $t_3$.

Figure 5:
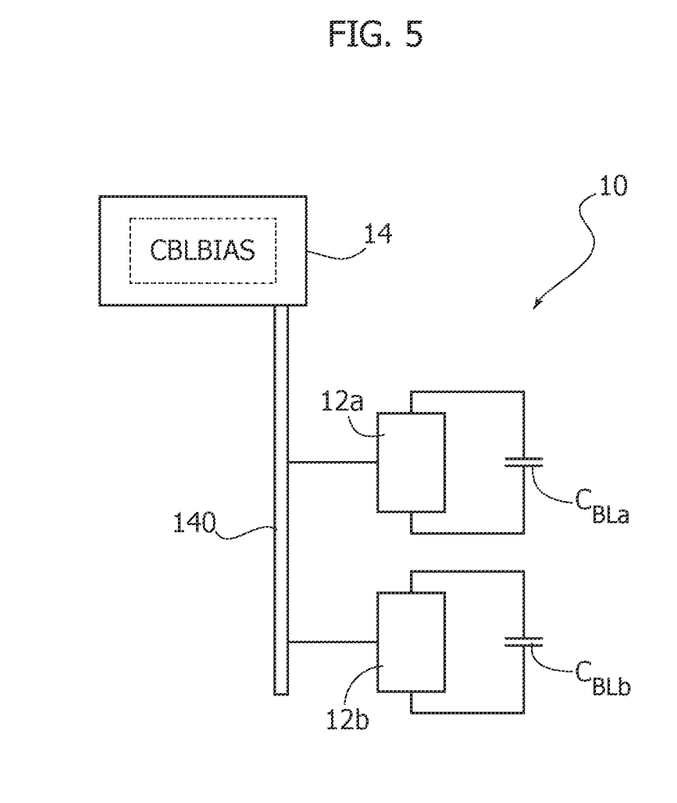
FIGS. 5 and 6 are circuit diagrams of alternative embodiments.
Figure 6:
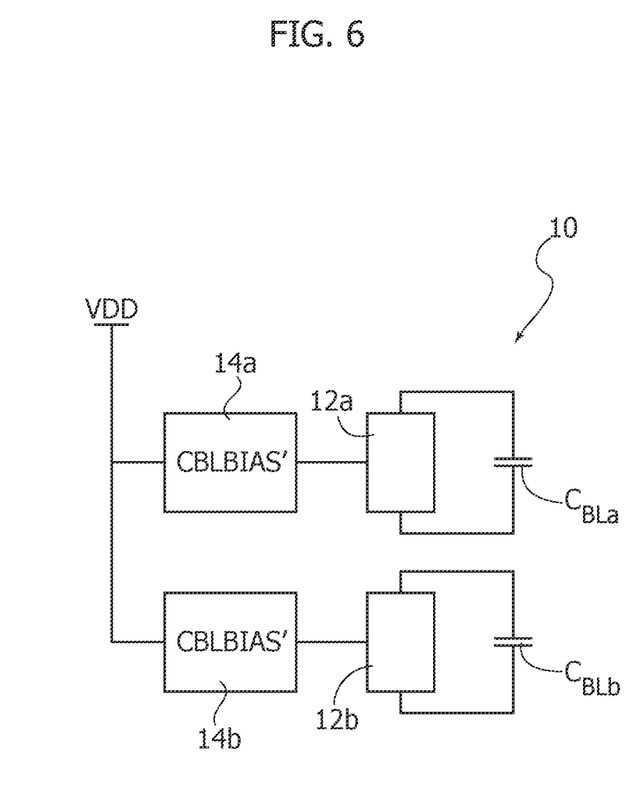

As exemplified in FIGS. 5 and 6, a memory circuit block 10 includes a plurality of arrays of memory cells coupled to common bitlines having respective bitline capacitances $C_{BLa}$, $C_{BLb}$, and each coupled to a respective sense amplifier 12a, 12b.

In embodiments, the sense amplifier 12 exemplified in FIG. 2 is configured to read wordlines having K=79 bits each selected by asserting at the "high" level just one control signal (for example, $YO\_UP_j$ and $YO\_DW_j$ to select K bitlines and the $WL\_UP_x$ to select the K bit-cells of such K bitlines in the row x) and a reference bit VISENSE, in a manner per se known.

As a result, during the pre-charge phase t2-t3 as exemplified in FIG. 4, a total of 79 UP and 79 DW equivalent bitline capacitances $C_{BL}$ is charged.

In an exemplary case where the pre-charge circuit 14 as exemplified in FIG. 3 is coupled to the sense amplifier circuit exemplified in FIG. 2, the power supply voltage level at the second node VBLBIAS can be calculated as:

$$VBLBIAS = VDD \times \frac{CBLBIAS}{CBLBIAS + 2 \times 79 \times CBL},$$

where $C_{BL}$ is the equivalent capacitance of bitline BL.

As exemplified in FIG. 5, a single pre-charge circuit 14, including a tank capacitance CBLBIAS, can be coupled to each sense amplifier in the plurality of sense amplifiers 12a, 12b to provide the bias voltage VBLBIAS thereto.

In the example considered, a dedicated metallization 140 may be designed to sustain current peak values (e.g., about 500 mA) in coupling this relatively big tank capacitance CBLBIAS to the bitline capacitances $C_{BLa}$, $C_{BLb}$.

In an alternative case, as exemplified in FIG. 6, the memory 10 includes a plurality of pre-charge circuits 14a, 14b and a plurality of sense amplifier circuits 12a, 12b, wherein each bitline (e.g., $C_{BLa}$) has a respective sense amplifier (e.g., 12a) and a respective pre-charge circuit (e.g., 14a) coupled thereto—the respective pre-charge circuit having a tank capacitance configured to provide a fraction of the total tank capacitance value used to charge all the bitline capacitances $C_{BLa}$, $C_{BLb}$.

In an exemplary case where the plurality of bitlines $C_{BLa}$, $C_{BLb}$ has a total equivalent capacitance about twice seventy-nine times a single bitline capacitance $C_{BL}$ (2×79×CBL), and each sense amplifier circuit 12a, 12b, includes a sense amplifier 12 as exemplified in FIG. 2, each pre-charge circuit of the plurality of pre-charge circuits 12a, 12b, can be equipped with a tank capacitance CBLBIAS' that is a fraction of the single tank capacitance CBLBIAS used in the arrangement exemplified in FIG. 5, for example, CBLBIAS'=CBLBIAS/79.

As exemplified in FIG. 6, this arrangement can reduce a peak current value (e.g., from 500 mA to 6.3 mA) and render it more manageable with relatively easy electrical wiring means providing currents suitable to charge bitline capacitances $C_{BLa}$, $C_{BLb}$, via respective pre-charge circuits 12a, 12b.

It will be otherwise understood that the various individual implementing options exemplified throughout the figures accompanying this description is not necessarily intended to be adopted in the same combinations exemplified in the figures. One or more embodiments may thus adopt these (otherwise non-mandatory) options individually or in different combinations with respect to the combination exemplified in the accompanying figures.

Without prejudice to the underlying principles, the details and embodiments may vary, even significantly, with respect to what has been described by way of example only, without departing from the extent of protection.

Various embodiments and variants have been described. Those skilled in the art will understand that certain features of these various embodiments and variants may be combined, and other variants will occur to those skilled in the art. For example, other countermeasures than those described may be implemented.

Finally, the practical implementation of the described embodiments and variants is within the abilities of those skilled in the art based on the functional indications given hereabove.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method, comprising:
   accessing memory cells in an array of memory cells storing respective data signals, each memory cell in the array of memory cells having a first node selectively couplable to respective bitline branches in a first set of bitline branches and a second node selectively couplable to respective bitline branches in a second set of bitline branches, the first set of bitline branches and the second set of bitline branches having a bitline capacitance for storing a bias level of charge in response to being charged;
   applying a bias voltage to an access capacitor referenced to ground such that a corresponding bias level of charge is charged at the access capacitor;
   terminating the applying of the bias voltage to the access capacitor;
   coupling the access capacitor to the first set of bitline branches and the second set of bitline branches;
   charging the bitline capacitance to the bias level of charge;
   decoupling the access capacitor from the bitline capacitance;
   selecting a first memory cell in the array of memory cells;
   coupling the first node of the first memory cell to a respective bitline branch in the first set of bitline branches;
   coupling the second node of the first memory cell to a respective bitline branch in the second set of bitline branches; and
   detecting a variation in a level of charge stored in the bitline capacitance with respect to the bias level of charge, the variation in the level of charge being indicative of a data signal stored in the memory cell.

2. The method of claim 1, wherein the array of memory cells is a planar array including a plurality of bitline branches having respective bitline capacitances configured to store respective bias levels of charge.

3. The method of claim 2, further comprising:
   coupling access capacitor as charged to the plurality of bitline branches by selectively making conductive a first current flow path between a first capacitor node and the plurality of bitlines branches;
   charging bitline capacitances to the respective bias levels of charge via a bias current flowing through the first current flow path; and
   decoupling the access capacitor from the plurality of bitline branches by selectively making non-conductive the first current flow path between the first capacitor node and the bitline capacitances of the plurality of bitline branches.

4. The method of claim 3, further comprising:
   selecting a first memory cell in the array of memory cells and coupling the first and second nodes of the first memory cell to respective bitlines in the plurality of bitline branches; and
   detecting a variation in charge levels stored in the respective bitline capacitances of the plurality of bitline branches with respect to the respective bias levels of charge, the variation in charge levels being indicative of data signals stored in the first memory cell.

5. The method of claim 4, further comprising:
   selecting a plurality of memory cells in the array of memory cells and coupling the first and second nodes of the selected plurality of memory cells to respective bitlines in the plurality of bitline branches; and
   detecting a plurality of variations of charge levels stored in the respective bitline capacitances of the plurality of bitline branches with respect to the respective bias levels of charge, the plurality of variations of charge levels being indicative of data signals stored in the selected plurality of memory cells.

6. The method of claim 3, further comprising:
   having a plurality of capacitors each having a capacitance equal to a respective fraction of the access capacitor;
   applying a corresponding bias voltage level to the plurality of capacitors such that respective charge is loaded on each of the plurality of capacitors;
   terminating the applying of the corresponding bias voltage level to the plurality of capacitors,
   coupling the plurality of capacitors as charged to the plurality of bitline branches by:
     selectively making conductive a plurality of current flow paths between the plurality of capacitors and the plurality of bitline branches, and
     charging bitline capacitances to the corresponding bias levels of charge via currents flowing through the plurality of current flow paths, the currents being a fraction of the bias current; and decoupling the plurality of capacitors from the plurality of bitline branches by selectively making non-conductive the plurality of current flow paths between the plurality of capacitors and the plurality of bitline branches.

7. The method of claim 6, wherein the array of memory cells corresponding to memory cells of a non-volatile data storage device.

8. A circuit, comprising:

a sense amplifier circuit couplable to memory cells in an array of memory cells storing respective data signals, each memory cell in the array of memory cells having a first node selectively couplable to respective bitline branches in a first set of bitline branches and a second node selectively couplable to respective bitline branches in a second set of bitline branches, the first set of bitline branches and the second set of bitline branches having at least one bitline capacitance configured to store a bias level of charge in response to being charged, the sense amplifier circuit configured to:

select a first memory cell in the array of memory cells, couple the first node of the first memory cell to a respective bitline branch in the first set of bitline branches, couple the second node of the first memory cell to a respective bitline in the second set of bitline branches, and detect a variation in a level of charge stored in the bitline capacitance with respect to the bias level of charge, the variation in the level of charge being indicative of a data signal stored in the first memory cell;

a pre-charge circuit comprising an access capacitor referenced to ground;

a power supply circuit configured to have a bias voltage level, the access capacitor having a node selectively couplable to the power supply circuit; and a control circuit coupled to the pre-charge circuit and the sense amplifier circuit, the control circuit configured to operate the pre-charge circuit to:

couple the power supply circuit to the access capacitor, apply a bias voltage level to the access capacitor such that a corresponding bias level of charge is charged on the access capacitance, terminating the application of the bias voltage level to the access capacitor, wherein the control circuit is further configured to operate the sense amplifier circuit to:

couple the access capacitor to the first set of bitline branches and the second set of bitline branches, charge the bitline capacitance to the bias level of charge, and decouple the access capacitor from the bitline capacitance.

9. The circuit of claim 8, wherein the array of memory cells is a planar array including a plurality of bitline branches having respective bitline capacitances configured to store respective bias levels of charge.

10. The circuit of claim 9, wherein the pre-charge circuit comprises a plurality of capacitors referenced to ground, the capacitance of each of the plurality of capacitors being equal to a respective fraction of the access capacitor, the control circuit configured to drive the pre-charge circuit to:

couple the power supply circuitry to the plurality of capacitors;

apply the bias voltage level to the plurality of capacitors;

charge the plurality of capacitors to a respective charge fraction; and terminate the applying of the bias voltage level to the plurality of capacitors.

11. The circuit of claim 10, wherein the control circuit is configured to drive the sense amplifier circuit to couple each capacitor in the plurality of capacitors to bitlines in the plurality of bitline branches by:

selectively making conductive a plurality of current flow paths between the plurality of capacitors and the plurality of bitline branches; and charging each respective bitline capacitance to the respective bias levels of charge via currents flowing through the plurality of current flow paths, the currents being a fraction of the bias current.

12. The circuit of claim 11, wherein the control circuit is configured to drive the sense amplifier circuit to decouple the plurality of capacitors from the plurality of bitline branches by selectively making non-conductive the plurality of current flow paths between the plurality of capacitors and the plurality of bitline branches.

13. The circuit of claim 12, wherein the control circuit is further configured to drive the sense amplifier circuit to:

select a plurality of memory cells in the array of memory cells and couple first and second nodes of the selected plurality of memory cells to respective bitline branches in the plurality of bitline branches; and detect a plurality of variations of charge levels stored in respective bitline capacitances of the plurality of bitline branches with respect to respective bias charge levels, wherein the plurality of variations of charge levels are indicative of data signals stored in the selected plurality of memory cells.

14. The circuit of claim 8, wherein the circuit corresponds to a circuit of a non-volatile data storage device.

15. A non-volatile data storage device, comprising:

memory cells in an array of memory cells storing respective data signals, each memory cell in the array of memory cells having a first node selectively couplable to respective bitline branches in a first set of bitline branches and a second node selectively couplable to respective bitline branches in a second set of bitline branches, the first set of bitline branches and the second set of bitline branches having at least one bitline capacitance configured to store a bias level of charge in response to being charged;

a sense amplifier circuit coupled to the memory cells, configured to:

select a first memory cell in the array of memory cells, couple the first node of the first memory cell to a respective bitline branch in the first set of bitline branches, couple the second node of the first memory cell to a respective bitline in the second set of bitline branches, and detect a variation in a level of charge stored in the bitline capacitance with respect to the bias level of charge, the variation in the level of charge being indicative of a data signal stored in the first memory cell;

a pre-charge circuit comprising an access capacitor referenced to ground;

a power supply circuit configured to have a bias voltage level, the access capacitor having a node selectively couplable to the power supply circuit; and a control circuit coupled to the pre-charge circuit and the sense amplifier circuit, the control circuit configured to operate the pre-charge circuit to:
  couple the power supply circuit to the access capacitor,
  apply a bias voltage level to the access capacitor such that a corresponding bias level of charge is charged on the access capacitance,
  terminating the application of the bias voltage level to the access capacitor,
wherein the control circuit is further configured to operate the sense amplifier circuit to:
  couple the access capacitor to the first set of bitline branches and the second set of bitline branches,
  charge the bitline capacitance to the bias level of charge, and
  decouple the access capacitor from the bitline capacitance.

16. The non-volatile data storage device of claim 15, wherein the array of memory cells is a planar array including a plurality of bitline branches having respective bitline capacitances configured to store respective bias levels of charge.

17. The non-volatile data storage device of claim 16, wherein the pre-charge circuit comprises a plurality of capacitors referenced to ground, the capacitance of each of the plurality of capacitors being equal to a respective fraction of the access capacitor, the control circuit configured to drive the pre-charge circuit to:
  couple the power supply circuitry to the plurality of capacitors;
  apply the bias voltage level to the plurality of capacitors;
  charge the plurality of capacitors to a respective charge fraction; and
  terminate the applying of the bias voltage level to the plurality of capacitors.

18. The non-volatile data storage device of claim 17, wherein the control circuit is configured to drive the sense amplifier circuit to couple each capacitor in the plurality of capacitors to bitlines in the plurality of bitline branches by:
  selectively making conductive a plurality of current flow paths between the plurality of capacitors and the plurality of bitline branches; and
  charging each bitline capacitance to the respective bias levels of charge via currents flowing through the plurality of current flow paths, the currents being a fraction of the bias current.

19. The non-volatile data storage device of claim 18, wherein the control circuit is configured to drive the sense amplifier circuit to decouple the plurality of capacitors from the plurality of bitline branches by selectively making non-conductive the plurality of current flow paths between the plurality of capacitors and the plurality of bitline branches.

20. The non-volatile data storage device of claim 19, wherein the control circuit is further configured to drive the sense amplifier circuit to:
  select a plurality of memory cells in the array of memory cells and couple first and second nodes of the selected plurality of memory cells to respective bitlines in the plurality of bitline branches; and
  detect a plurality of variations of charge levels stored in respective bitline capacitances of the plurality of bitline branches with respect to respective bias charge levels, wherein the plurality of variations of charge levels are indicative of data signals stored in the selected plurality of memory cells.

* * * * *